United States Patent
Padilla et al.

(10) Patent No.: US 11,715,541 B2
(45) Date of Patent: *Aug. 1, 2023

(54) WORKLOAD ADAPTIVE SCANS FOR MEMORY SUB-SYSTEMS

(71) Applicant: Micron Technology, Inc., Boise, ID (US)

(72) Inventors: Renato C. Padilla, Folsom, CA (US); Sampath K. Ratnam, San Jose, CA (US); Christopher M. Smitchger, Garden City, ID (US); Vamsi Pavan Rayaprolu, San Jose, CA (US); Gary F. Besinga, Boise, ID (US); Michael G. Miller, Boise, ID (US); Tawalin Opastrakoon, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/867,538

(22) Filed: Jul. 18, 2022

(65) Prior Publication Data

US 2022/0351796 A1 Nov. 3, 2022

Related U.S. Application Data

(63) Continuation of application No. 17/127,012, filed on Dec. 18, 2020, now Pat. No. 11,393,548.

(51) Int. Cl.
*G11C 29/10* (2006.01)
*G06F 11/07* (2006.01)
(Continued)

(52) U.S. Cl.
CPC ............ *G11C 29/10* (2013.01); *G06F 11/076* (2013.01); *G06F 11/0736* (2013.01);
(Continued)

(58) Field of Classification Search
CPC . G11C 29/10; G11C 29/52; G11C 2029/0409; G11C 7/12; G11C 8/08;
(Continued)

(56) References Cited

U.S. PATENT DOCUMENTS 7,039,642 B1 5/2006 Horvitz et al.
8,204,907 B1 6/2012 Smith
(Continued)

FOREIGN PATENT DOCUMENTS

CN 111247587 A 6/2020
CN 112119382 A 12/2020

OTHER PUBLICATIONS

N. Mekhiel, "Cache Filter Method Based on DRAM Access Frequency to Improve System Performance," 2015 IEEE 17th International Conference on High Performance Computing and Communications, 2015 IEEE 7th International Symposium on Cyberspace Safety and Security, (Year: 2015).*

(Continued)

*Primary Examiner* — Cynthia Britt
(74) *Attorney, Agent, or Firm* — Lowenstein Sandler LLP

(57) ABSTRACT

A method includes associating each block of a plurality of blocks of a memory device with a corresponding frequency access group of a plurality of frequency access groups based on corresponding access frequencies, and performing scan operations on blocks of each of the plurality of frequency access groups using a scan frequency that is different from scan frequencies of other frequency access groups. A scan operation performed on a frequency access group with a higher access frequency uses a higher scan frequency than a scan operation performed on a frequency access group with a lower access frequency.

20 Claims, 11 Drawing Sheets

(51) Int. Cl.
  *G11C 29/52* (2006.01)
  *G06F 11/10* (2006.01)
(52) U.S. Cl.
  CPC ...... *G06F 11/0757* (2013.01); *G06F 11/1048* (2013.01); *G11C 29/52* (2013.01)
(58) Field of Classification Search
  CPC ............. G06F 11/0736; G06F 11/0757; G06F 11/076; G06F 11/1048; G06F 9/5011
  See application file for complete search history.

(56) References Cited

U.S. PATENT DOCUMENTS

| | | | | |
|---|---|---|---|---|
| 8,572,327 | B2* | 10/2013 | Burkard | G06F 12/0246 711/134 |
| 10,846,165 | B2 | 11/2020 | Brandt et al. | |
| 11,393,548 | B2* | 7/2022 | Padilla | G06F 11/0736 |
| 2009/0240678 | A1 | 9/2009 | Sadovsky et al. | |
| 2011/0271070 | A1* | 11/2011 | Worthington | G06F 3/0688 711/E12.001 |
| 2016/0266817 | A1 | 9/2016 | Kamimura | |
| 2017/0091106 | A1* | 3/2017 | Ash | G06F 3/0689 |
| 2018/0046411 | A1 | 2/2018 | Coburn et al. | |
| 2018/0357727 | A1 | 12/2018 | Zhang et al. | |
| 2019/0103164 | A1 | 4/2019 | Malshe et al. | |
| 2019/0237146 | A1 | 8/2019 | Malshe et al. | |

OTHER PUBLICATIONS

J. Liao, Z. Cai, F. Trahay and X. Peng, "Block Placement in Distributed File Systems Based on Block Access Frequency," in IEEE Access, vol. 6, pp. 38411-38420, 2018. (Year: 2018).

X. Ye and Z. Zhai, "Cold-warm-hot block wear-leveling algorithm for a NAN D flash storage system," 2017 4th International Conference on Systems and Informatics (ICSAI), Hangzhou, China, 2017, pp. 762-767. (Year: 2017).

\* cited by examiner

| GROUPS | READ COUNT (RC) THRESHOLD | SCAN FREQUENCY |
|---|---|---|
| HOT | RC > HOT_TH | HOT_FREQ = 2 WEEKS |
| WARM | COLD_TH < RC < HOT_TH | WARM_FREQ = 1 MONTH |
| COLD | COLD_TH < RC | COLD_FREQ = 2 MONTHS |

| MEMORY BLOCK GROUPINGS | ERROR BITS COUNT THRESHOLD |
|---|---|
| HOT | STRICT = 100 |
| WARM | MODERATE = 150 |
| COLD | LOOSE = 200 |

| MEMORY BLOCK GROUPINGS | VALLEY MARGIN THRESHOLD (SLC) |
|---|---|
| HOT | STRICT = 100 mV |
| WARM | MODERATE = 75 mV |
| COLD | LOOSE = 50 mV |

Maintain metadata associating each block of a plurality of blocks of the memory device with a corresponding frequency access group, wherein each frequency access group is associated with a corresponding scan frequency
901

Determine that a first predetermined time period has elapsed since a last scan operation performed with respect to one or more blocks of the memory device, wherein the first predetermined time period specifies a first scan frequency
903

Select, based on the metadata, at least one block from a first frequency access group associated with the first scan frequency
905

Perform a scan operation with respect to the selected block
907

Determine that a first block of a memory device is associated, based on a read count of the block, with a first frequency access group of a plurality of frequency access groups, wherein the first frequency access group is associated with a first scan frequency
1001

Scan the first block at a frequency according to the first scan frequency
1003

Scan a second block at a frequency according to a second scan frequency, wherein the second block is associated with a second frequency access group of the plurality of frequency access groups and the second frequency access group is associated with the second scan frequency
1005

FIG. 10

WORKLOAD ADAPTIVE SCANS FOR MEMORY SUB-SYSTEMS

RELATED APPLICATIONS

This application is a continuation application of co-pending U.S. patent application Ser. No. 17/127,012, filed Dec. 18, 2020, which is incorporated herein by reference.

TECHNICAL FIELD

Embodiments of the disclosure relate generally to memory sub-systems, and more specifically, relate to workload adaptive scans for memory sub-systems.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2 illustrates hot, warm, and cold block groupings and their scan frequencies in accordance with some embodiments of the present disclosure.

FIG. 6 illustrates a table that shows the relationship between block groups and an error threshold for folding in accordance with some embodiments of the present disclosure.

FIG. 7 illustrates a table that shows the relationship between block groups and a valley margin threshold for folding in accordance with some embodiments of the present disclosure.

FIG. 9 is a flow diagram of an example method to adaptively scan a block in accordance with some embodiments of the present disclosure.

FIG. 10 is a flow diagram of an example method to adaptively scan a block in accordance with some embodiments of the present disclosure.

DETAILED DESCRIPTION

Figure 1A:
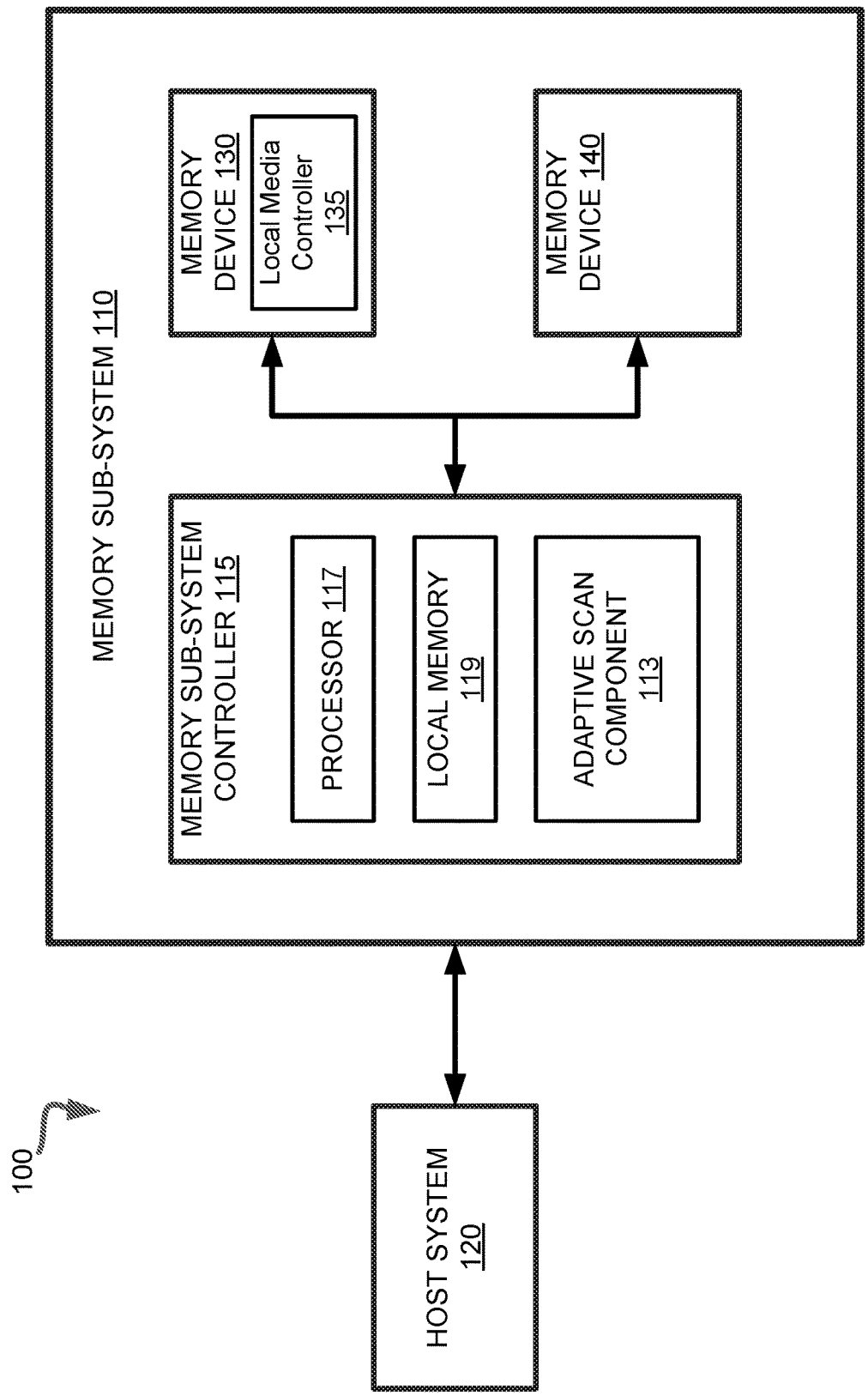
FIG. 1A illustrates an example computing system that includes a memory sub-system in accordance with some embodiments of the present disclosure.

Aspects of the present disclosure are directed to workload-based adaptive scans of a memory sub-system. A memory sub-system can be a storage device, a memory module, or a combination of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1A. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple memory cells arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

Non-volatile memory devices can be periodically scanned to check the "health" of the blocks of the memory device, which can be expressed by one or more data state metrics, such as read error rates. Scanning a memory device can involve reading multiple sample pages of a block for errors or by reading the same page multiple times to determine the error rates. In some implementations, the scan frequency can be kept at a predetermined constant level which ensures a satisfactory health state of the memory device. Although a constant scan frequency is simple and predictable, the drawback is that the fixed scan frequency does not scale well with the increasing memory capacity. If the number of pages to be scanned is decreased in order to improve the overall performance of the memory device, the scan coverage can suffer due to missed scans and the memory devices can start losing data. In various implementations, a memory device can change its scan frequency based on temperature, programmed cycle counts, and/or an elapsed time, but these changes would only address slow-charge loss associated with the memory devices.

Aspects of the present disclosure address the above and other deficiencies by having a memory sub-system that can adjust its scan frequency for groups of blocks. For example, a memory sub-system can associate a block to be one of a hot, a warm, or a cold group, based on access frequency of the block. Each group is associated with a range of workloads or access frequencies. Blocks with a high access frequency (e.g., hot group) can be scanned more frequently and blocks with a low access frequency (e.g., cold group) can be scanned less frequently. The variation in the scan frequency, where infrequently accessed blocks are scanned less frequently, alleviates the performance degradation that otherwise would have occurred due to the periodic scanning of the blocks. Furthermore, more frequent scans for blocks that are accessed more often ensures these blocks will have less errors since they are checked more often.

Furthermore, the data state metric threshold values that trigger media management operations (such as a folding operation, which involve copying the content of a given block to a new physical location on the memory device) can vary based on the frequency access group associated with a given block, since a higher error rate can be tolerated for less frequently accessed blocks. In an illustrative example, the data state metric can reflect the number of erroneous bits that exist in a given block.

The data state metric threshold values that trigger data management operations can be specified according to frequency access group associations. For example, a hot group can be associated with a first scan error threshold, the warm group has a second scan error threshold, and the cold group has a third scan error threshold, such that the first scan error threshold is more stringent than the second scan error threshold, which in turn is more stringent than the third scan error threshold. Using different scan error thresholds, the memory sub-system controller can perform media management operations on the blocks according to their workloads. E.g., blocks that are accessed frequently can be assigned a higher scan error threshold (e.g., a lower error bit count), while blocks that are accessed less frequent can be assigned a lower scan error threshold. This way, the memory sub-system ensures that frequently accessed blocks would exhibit a lower error rate.

Various aspects of the above referenced methods and systems are described in details herein below by way of examples, rather than by way of limitation.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes an adaptive scan component 113 that can scans blocks of a memory device at a scan frequency according to workloads of the blocks. A block is a memory unit. A workload of a block is the amount of memory accesses performed by the block, such as a count of the read accesses or read count. For example, a block with a high workload can be scanned more frequent while a block with a lower workload can be scanned less frequent. In some embodiments, the memory sub-system controller 115 includes at least a portion of the adaptive scan component 113. In some embodiments, the adaptive scan component 113 is part of the host system 110, an application, or an operating system. In other embodiments, local media controller 135 includes at least a portion of the adaptive scan component 113 and is configured to perform the functionality described herein.

Figure 1B:
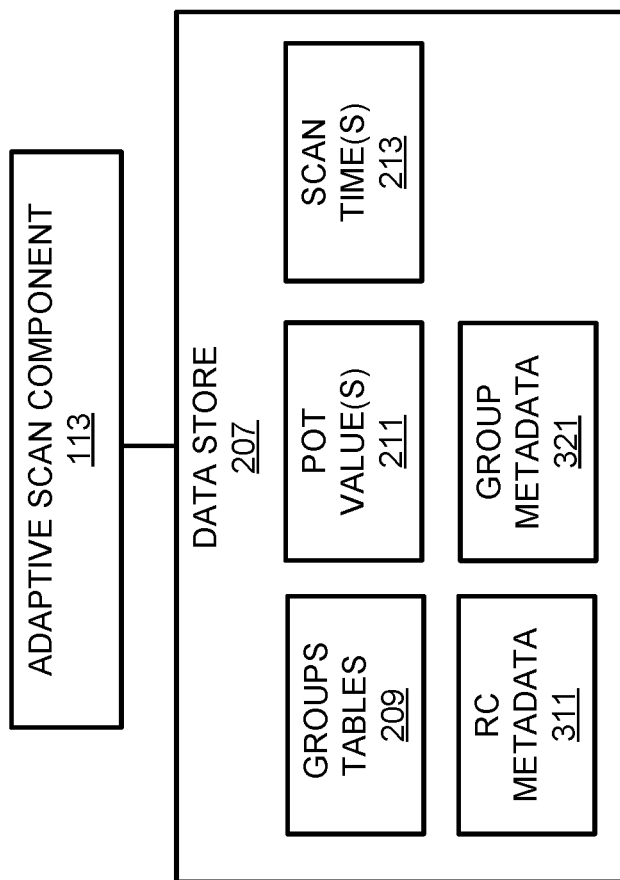
FIG. 1B illustrates a block diagram of an adaptive scan component in accordance with some embodiments of the present disclosure.

FIG. 1B illustrates a block diagram of adaptive scan component 113 in accordance with some embodiments of the present disclosure. Adaptive scan component 113 can communicate with data store 207. Data store 207 can be part of local memory 119 and/or memory devices 130-140. Data store 207 can include groups table 209, power-on-timer (POT) values 211, scan time(s) 213, read count metadata 311, and group metadata 321. Groups table 209 can store the block groupings and their relationships to read counts of the blocks, and scan frequencies, as further discussed in FIG. 2. Power-on-timer (POT) values 211 can store a POT value for a memory device since the last power on event for the memory device. Scan time(s) 213 can store a time since a last scan was performed for a group. Read count metadata 311 can store the read counts for the blocks. Group metadata 321 can store the group associations for the blocks of the memory devices 130-140.

Referring to FIG. 1B, adaptive scan component 113 can store a scan time for each of the groups. The scan time(s) 213 can track the time since the last scan has been performed for a group (hot, warm, cold) of blocks. The POT value can count a period of time (e.g., seconds, minutes, hours, etc.) that has elapsed since the last power-on event detected by the memory sub-system 110. FIG. 2 illustrates hot, warm, and cold block groups and their scan frequencies in accordance with some embodiments of the present disclosure. Table 200 (as part of group tables 209 of FIG. 1B) can be used by adaptive scan component 113 to determine the scan frequency for a block. As described, a block includes a set of pages, where a page is a group of memory cells of the memory devices 130-140. Although in the illustrative examples of FIGS. 2-7, a block is used as the unit for grouping employed by adaptive scan component 113, other units of grouping, such as a page, a plane, a die, multiples of dies, etc., can be utilized in various other implementations.

In one embodiment, adaptive scan component 113 can associate each block to a hot group, a warm group, or a cold group, according to the read count associated with the block. These groups, which reflect the block access frequency, are then used by component 113 to determine the scan frequency for a given block, such that the more frequently accessed blocks would be scanned more frequently than the less frequently accessed blocks, under the assumption that the higher error rate can be tolerated for less frequently accessed blocks. For example, the hot group can have a high scan frequency of 2 weeks (HOT_FREQ), the warm group can have a medium scan frequency of 1 month (WARM_FREQ), and the cold group can have a low scan frequency of 2 month (COLD_FREQ). Table 200 illustrates that blocks can be assigned to the groups according to their read counts. For example, a block with read count greater than a hot threshold (HOT_TH) is assigned to the hot group. A block with read count greater than a cold threshold (COLD_TH) but smaller than the hot threshold (HOT_TH) is assigned to the warm group and a block with read count smaller than the cold threshold (COLD_TH) is assigned to the cold group. Although three (hot, warm, cold) groups are shown, any numbers of groups can be implemented for various scan frequencies.

Adaptive scan component 113 can determine the read count for a given block . . . . Each block 303 in the memory device 301 has a corresponding read count 313 from read count metadata 311. Adaptive scan component 113 can store a read count in read count 313 for block 303. In one embodiment, each read count 313 of read count metadata 311 can be stored as metadata with their corresponding block (block 303) within memory devices 130-140 of FIG. 1A. In another embodiment, read count metadata 311 is stored in local memory 119 of the memory controller 115 of FIG. 1A, where adaptive scan component 113 can associate, by an index of the metadata or a memory address of the metadata, each element of metadata 311 to an element of memory device 301, e.g., element 303 (Blk[0][0]) can be mapped to element 313 (RC[0][0]).

Figure 3:
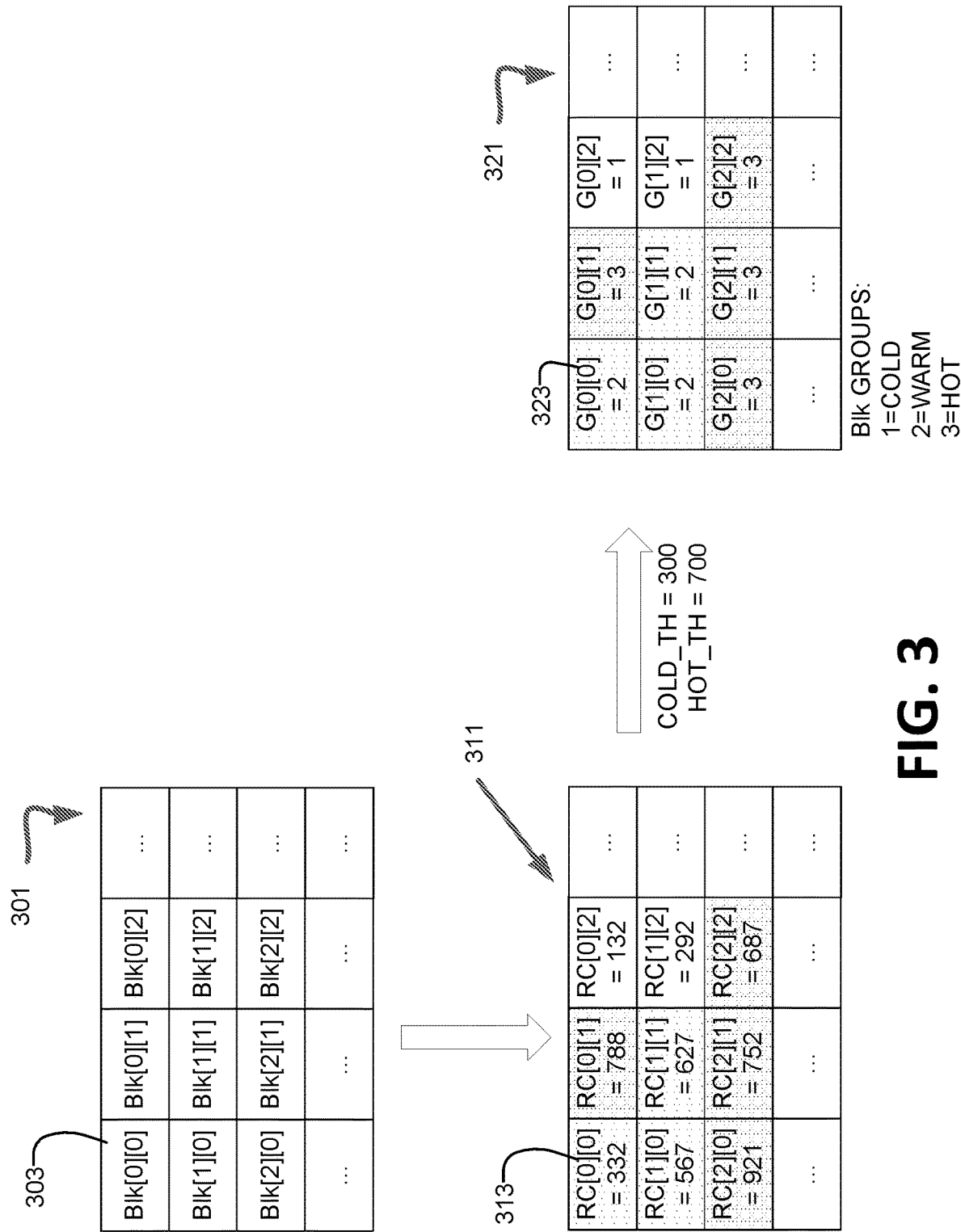
FIG. 3 illustrates read counts and groupings (hot, warm, and cold) of a block in accordance with some embodiments of the present disclosure.

In one embodiment, adaptive scan component 113 can group the blocks in matrix 301 into two or more groups reflecting the access frequencies of the blocks. The association of a given block to a particular frequency access group can be reflected by groupings metadata 321 of FIG. 3, where each element (e.g., read count 313) in the read count metadata 311 has a corresponding element (e.g., group 323) in groupings metadata 321. Adaptive scan component 113 can determine the groupings using the read count thresholds (COLD_TH=300, and HOT_TH=700) from table 200 of FIG. 2. E.g. if read count[0][0]=332, read count[0][0] is less than HOT_TH and read count[0][0] is greater than COLD_TH, the group metadata corresponding to block blk[0][0] is assigned the warm group, e.g., G[0][0]=2. Here, read count[0][0] and G[0][0] corresponds to blk[0][0]. In one embodiment, group matrix 323 can be stored as metadata with its corresponding block 303 within memory devices 130-140 of FIG. 1A. In another embodiment, group metadata 321 can be stored as an array, matrix, or a list in local memory 119 of the memory controller 115 of FIG. 1A. Note that although FIG. 3 shows read count 311 and groupings metadata 321 as two-dimensional arrays for purpose of illustration, read count 311 and groupings metadata 321 can be stored in any data structure in memory devices 130-140 and/or local memory 115.

Adaptive scan component 113 can update read count metadata 311 and group metadata 321 in response to certain conditions, e.g., a read operation, a memory subsystem power on, erase and write operations, etc. One of these conditions can be derived from a power-on-time (POT).

Figure 4:
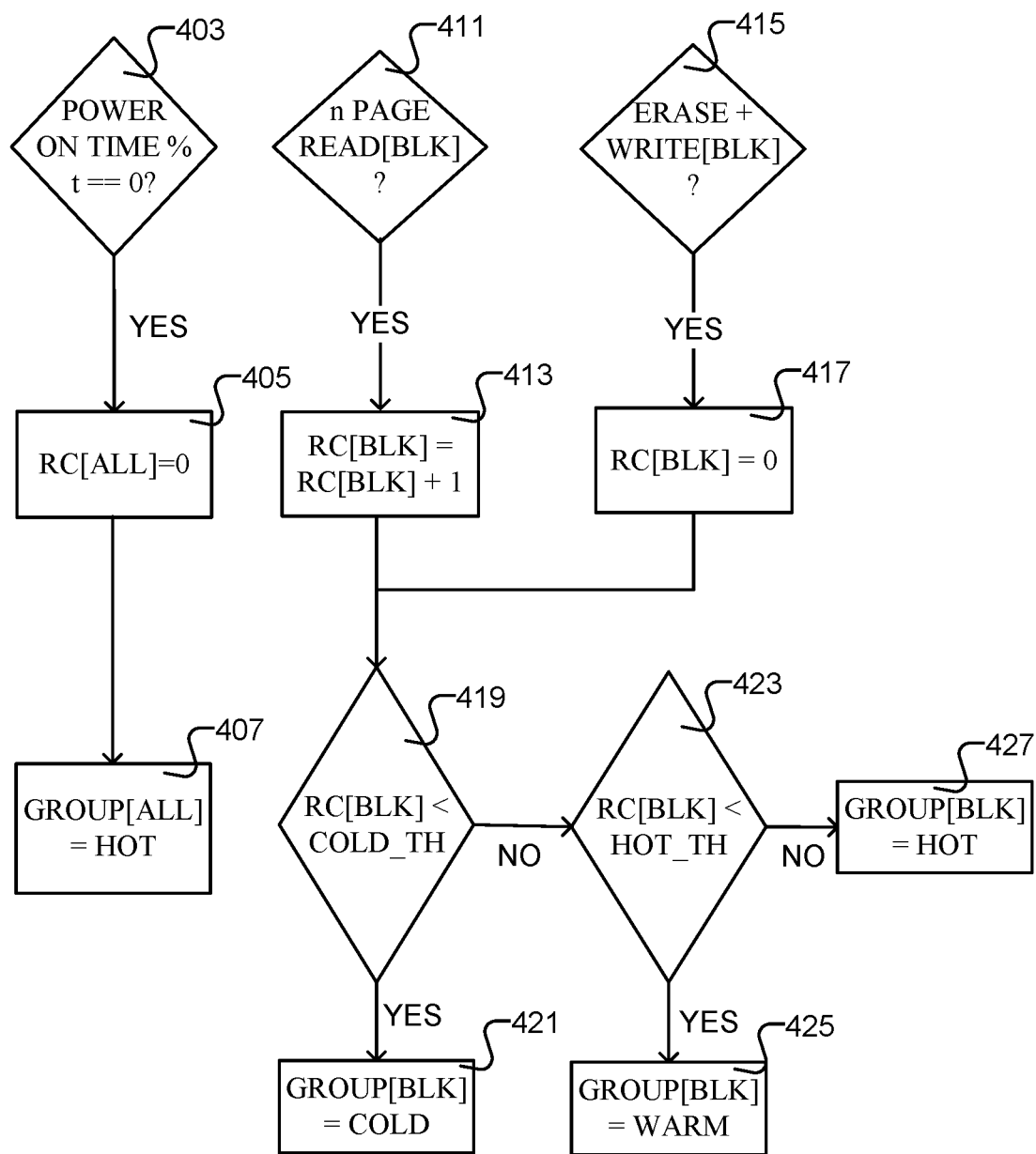
FIG. 4 illustrates a flow chart to update the read count and the grouping of a block in accordance with some embodiments of the present disclosure.

FIG. 4 illustrates a flow chart to update the read count and the grouping of a block in accordance with some embodiments of the present disclosure. The operations in flow chart 400 can be performed by adaptive scan component 113 to update the read count metadata 311 and/or group metadata 321.

Referring to FIG. 4, at operation 403, processing logic determines if a power on time (POT) value of the memory device(s) reaches intervals of t. E.g., POT % t==0, where POT refers to a timer that counts the time since a last power on event, t represents a threshold time period where all blocks in the memory are scanned once to ensure reliability of the blocks, and % represents a modulo operation which returns the remainder of a division operation. At operation 405, if processing logic determines the POT value of the memory device(s) reaches intervals of a maximum scan period t, process logic resets the read counts for all blocks in the memory device(s) associated with the POT value. At operation 407, processing logic assigns these blocks as "hot" (i.e., the most frequently accessed group). Here, operations 405-407 can ensure the memory devices are scanned at least once according to the maximum scan period t.

At operation 411, processing logic determines if the memory controller performed n page read operations on a block, where n can be any predetermined natural number. At operation 413, if processing logic determines that there are n page read operations performed on a block, processing logic increments the read count by 1 for the block, and proceeds to operation 419. That is, the read count to read operations can be a 1 to n ratio. At operation 415, processing logic determines if memory controller performed an erase and a write operation on a block, e.g., new data. At operation 417, if processing logic determines that there is an erase, or an erase and a write operation performed on a block, processing logic resets the read count for the block, and proceeds to operation 419. Thus newly written blocks default to the COLD group.

At operation 419, processing logic determines if the read count for the block is less than a cold group read count threshold (COLD_TH). At operation 421, if processing logic determines the read count for the block is less than the cold group read count threshold (COLD_TH), processing logic assigns the block to the cold group (COLD).

At operation 423, if processing logic determines the read count for the block is not less than the cold group read count threshold (COLD_TH), processing logic determines if the read count for the block is less than the hot group read count threshold (HOT_TH). At operation 425, if processing logic determines the read count for the block is less than the hot group read count threshold (HOT_TH), processing logic assigns the block to the warm group (WARM).

At operation 427, if processing logic determines the read count for the block is not less than the hot group read count threshold (HOT_TH), processing logic assigns the block to the hot group (HOT). Although FIG. 4 only shows three groups (cold, warm, and hot), any number of groups are possible.

Figure 5:
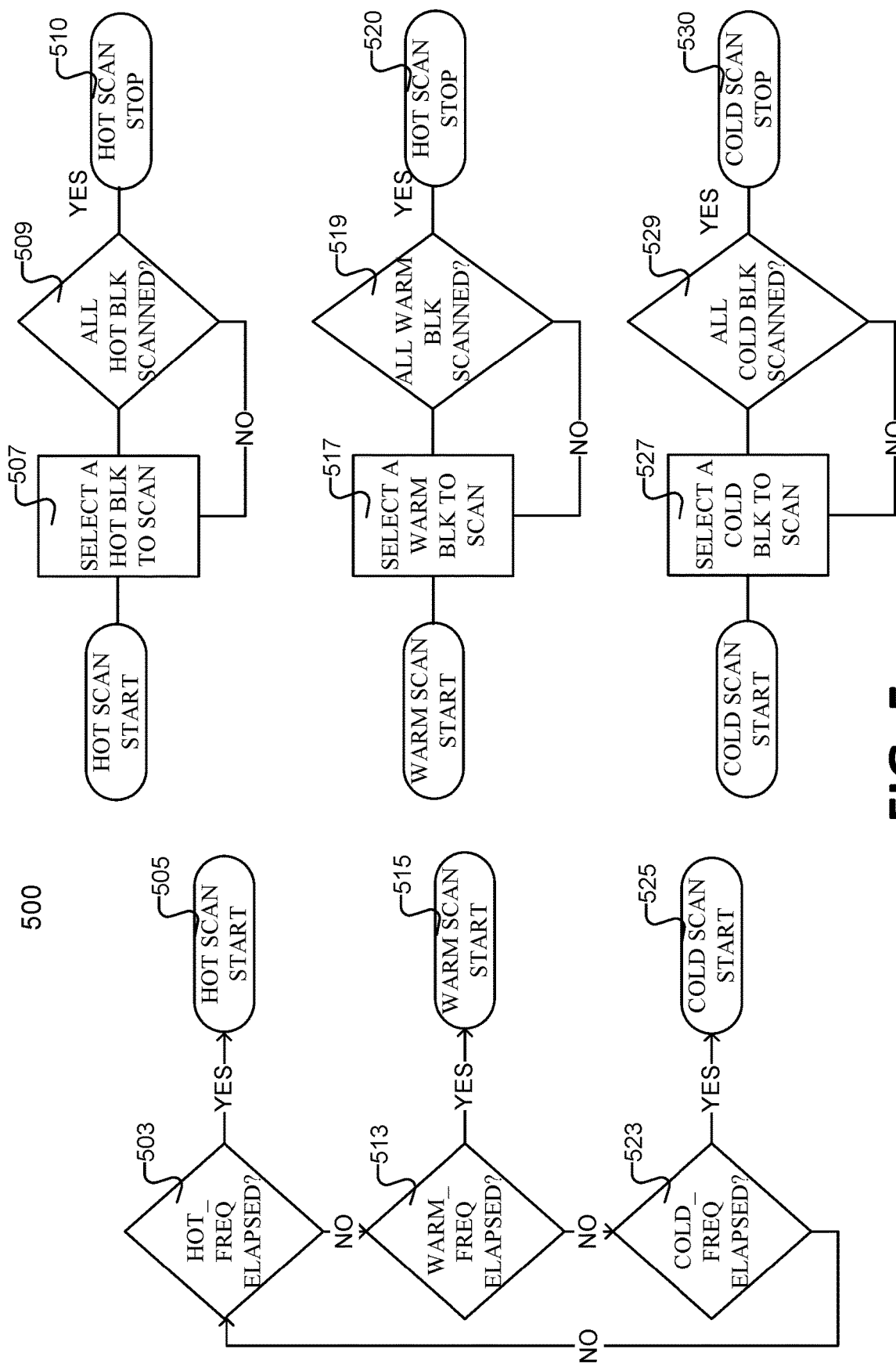
FIG. 5 illustrates a flow chart to scan the blocks in accordance with some embodiments of the present disclosure.

Once the grouping of a block is assigned, adaptive scan component 113 can start scanning the blocks, according to scan frequencies corresponding to the groupings. Adaptive scan component 113 can use a scan time (such as scan time(s) 213 of FIG. 1B or a time derived from POT value(s) 211 of FIG. 1B) to determine if a time interval for a scan frequency has elapsed since the last scan for the group. FIG. 5 illustrates a flow chart to scan the blocks in accordance with some embodiments of the present disclosure. Flow chart 500 can be performed by adaptive scan component 113 to start a memory block scan.

Referring to FIG. 5, at operation 503, processing logic determines, using a scan time (such as scan time(s) 213 of FIG. 1B), if a time interval for the scanning frequency for the hot group (HOT_FREQ) has elapsed since the last scan for the group. If yes, at operation 505, processing logic starts a scan for the hot groupings. In one embodiment, processing logic can initialize another processing thread to start this scan operation.

At operation 513, if processing logic determines the time interval for the scanning frequency for the hot group (HOT_FREQ) has not elapsed, processing logic determines if a time interval for the scanning frequency for the warm group (WARM_FREQ) has elapsed. If yes, at operation 515, processing logic starts a scan for the warm groupings. In one embodiment, processing logic can initialize another processing thread to start this scan.

At operation 523, if processing logic determines the time interval for the scanning frequency for the warm group (WARM_FREQ) has not elapsed, processing logic determines if a time interval for the scanning frequency for the cold group (COLD_FREQ) has elapsed. If yes, at operation 525, processing logic starts a scan for the COLD groupings. In one embodiment, processing logic can initialize another processing thread to start this scan. If no, operation 523 proceeds to operation 503.

If a scan for the hot group starts, at operation 507, processing logic selects a block that is associated with the hot grouping and scans the block. In one embodiment, the hot block is selected randomly among all the hot blocks. The random selection allows the blocks to be scanned at random orderings. At operation 509, processing logic determines if all the hot blocks has been scanned. If yes, at operation 510, the scan stops. If no, processing logic returns to operation 507 to select another hot block to scan.

If a scan for the warm group starts, at operation 517, processing logic selects a block that is associated with the warm grouping and scans the block. In one embodiment, the warm block is selected randomly among all the warm blocks associated to the group. At operation 519, processing logic determines if all the hot blocks associated to the group has been scanned. If yes, at operation 520, the scan stops. If not, processing logic returns to operation 517 to select another warm block to scan.

If a scan for the cold group starts, at operation 527, processing logic selects a block that is associated with the cold grouping and scans the block. In one embodiment, the cold block is selected randomly among all the cold blocks associated to the group. At operation 529, processing logic determines if all the cold blocks associated to the group has been scanned. If yes, at operation 530, the scan stops. If not, processing logic returns to operation 527 to select another cold block to perform the scan operation.

In one embodiment, adaptive scan component 113 can pre-configure a media management triggering condition for the scanned blocks, e.g., a condition indicating when adaptive scan component 113 is to perform a media management operation (such as a folding operation) to the block. A memory sub-system controller can perform media management operations to mitigate the amount of data loss on the memory devices due to high workloads. For example, the memory sub-system controller can perform a media management operation (e.g., a folding operation) to refresh a block of a memory device. A folding operation refers to the block being refreshed, e.g., the data in the block is copied to a new block. Folding can also correct any error bits in the block. Folding can ensure that a memory device does not loss data over time. Here, folding a block can correct any error bits within memory cells of the block and restores the memory cell to their expected charge states, before the number of error bits of the block reaches an error correction threshold where the error bits can no longer be corrected.

Adaptive scan component 113 can perform a scan operation on a block by performing read operations on the memory cells in the block. For the scan operation, adaptive scan component 113 can detect the error bits in the memory cells of a page (or a block) by reading the cells in the page and comparing the read bits with some error checking mechanism for the page. An error checking mechanism refers to a technique for correcting one or more erroneous bits in data by storing, on the media, some redundant bits in order to validate the remaining bits. Examples of error checking mechanisms include error correction codes, checksums, hashes, etc. The error correction mechanisms can refer to various techniques for encoding a sequence of bits using some redundant bits. The redundant bits enable the detection and/or recovery of a limited number of error bits that can occur anywhere in the sequence of bits. In another embodiment, the scan operation performs a predetermined number of read operations at random pages of the block to determine an error rate or a count of error bits for the scan.

In one embodiment, adaptive scan component 113 can perform a media management operation (e.g., folding) on a block if adaptive scan component 113 detects error bits and determines that a count of errors bit for the block met a scan error threshold. In one embodiment, the count of error bits can be determined as an average of the count of error bits for a predetermined number of randomly selected pages within the block.

FIG. 6 illustrates a table that shows the association between block groups and scan error thresholds in accordance with some embodiments of the present disclosure. Table 706 (as part of tables 209 of FIG. 1B) illustrates the memory block groups and corresponding error bits count thresholds for folding. Here, the error bits count threshold is one data state metric threshold. In this example, the hot group is associated with a strict scan error threshold. That is, if a scanned hot block results in (STRICT=100) error bits, adaptive scan component 113 would schedule the block to be folded. The warm group is associated with a moderate condition. If a scanned warm block results in (MODERATE=150) error bits, adaptive scan component 113 would schedule the block to be folded. The cold group is associated with a loose condition. That is, if a scanned cold block results in (LOOSE=200) error bits, adaptive scan component 113 would schedule the block to be folded. Note that in this example, the error correction mechanism should be able recover up to 200 error bits.

The count of error bits can reflect the valley margins of a block, and the valley margin thresholds can be a substitute indicator indicating if a block should be folded. A valley margin refers to a relative width or relative margin between pairs of adjacent programming distributions, as further described in FIG. 8. A valley margin represents a working range of control voltages tolerated by the cells of the block. Thus, a larger valley margin is desirable.

FIG. 7 illustrates a table that shows the relationship between block groups and valley margin thresholds for folding in accordance with some embodiments of the present disclosure. Table 707 (as part of tables 209 of FIG. 1B) can be valley margins thresholds for SLC memory cells. Referring to FIG. 7, in this example, the hot group is associated with a strict condition. That is, if a hot block has a valley margin smaller than (STRICT=200 millivolts), adaptive scan component 113 would schedule the block to be folded. The warm group is associated with a moderate condition. If a scanned warm block has a valley margin smaller than (MODERATE=150 millivolts), adaptive scan component 113 would schedule the block to be folded. The cold group is associated with a loose condition. That is, if a scanned cold block has a valley margin smaller than (LOOSE=50 millivolts), adaptive scan component 113 would schedule the block to be folded.

Note that SLC, MLC, TLC, and QLC memory cells can have their corresponding valley margins. A single-level cell (SLC) can store one bit per memory element, whereas a multi-level cell (MLC) is a memory element that is capable of storing more than a single bit of information. The charge state of the memory cell can be programmed and the charge state of the memory can be determined by comparing a read voltage of the memory cell against one or more read level thresholds. That is, with SLC NAND flash technology, each cell can exist in one of two charge states, storing one bit of information per cell, whereas MLC NAND flash memory has four or more possible charge states per cell, so each MLC-based cell can store two or more bits of information per cell. The higher number of possible charge states reduces the amount of margin (e.g., valley margin) separating the charge states.

The error threshold and valley margin threshold for folding (folding thresholds) specified for different groups can ensure the blocks with a high workload (hot group) would be scanned more often and will have the most accurate and up to date information. These blocks need to have the least amount of errors. While, infrequently accessed blocks (cold group) would be scanned less often and will have less impact on performance, thus, the folding thresholds for these blocks can be relaxed. Furthermore, high read errors encountered from the cold group of blocks can be tolerated because the cold group of blocks are only a smaller portion of the total workload of the memory devices.

Figure 8A:
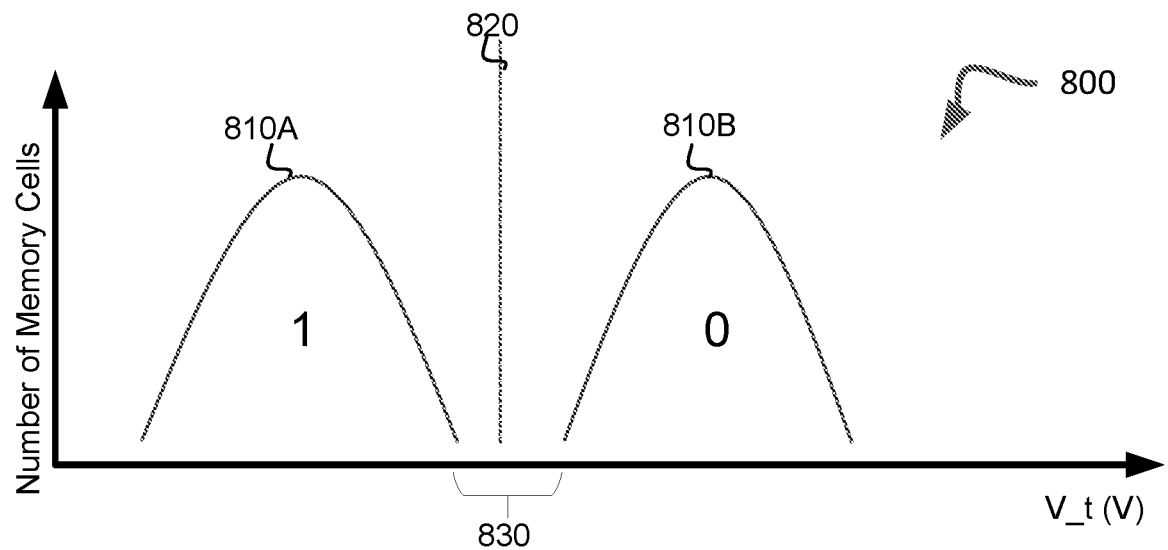
FIGS. 8A-8B illustrates distributions of threshold voltages for a number of memory cells in a block accordance with some embodiments of the present disclosure.
Figure 8B:
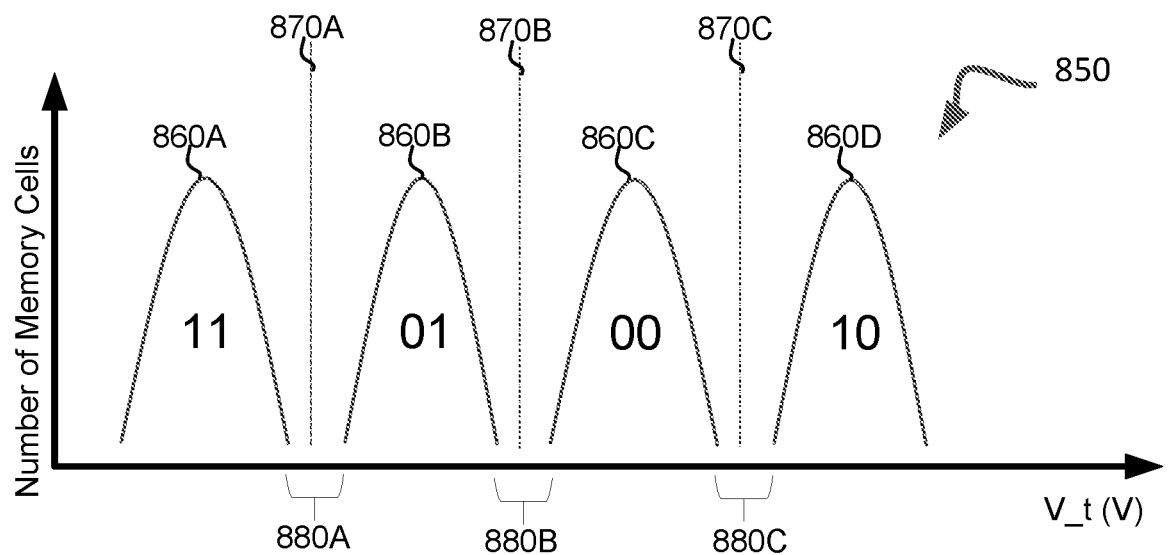

FIGS. 8A-8B illustrate distributions of threshold voltages for a number of memory cells in a block accordance with some embodiments of the present disclosure. Referring to FIG. 8A, diagram 800 can represent threshold voltages distributions for a block of SLCs. Programming distributions 810A represents the logical state "1" and programming distributions 810B represents the logical state "0". The distributions 810 are interspersed with voltage intervals ("valley margins") 830 where none (or very few) of the memory cells of the device have their threshold voltages V_t. Such valley margins can be used to separate the various charge states. Thus, the logical states of the cell can be determined by detecting, during a read operation, between which two valley margins the respective threshold voltage V_t of the cell resides. For example, adaptive scan component 113 can perform a read operation by applying a reference voltage level 820 to the cells and comparing the measured threshold voltage V_t exhibited by the memory cell to reference voltage level 820 to determine if the measured threshold voltage of the memory cell is above (e.g., memory cell is off) or below the voltage level (e.g., memory cell is on).

Referring to FIG. 8B, diagram 850 can represent threshold voltages distributions for a block of MLC storing two bits of information. Programming distributions 860A-D can represent the logical states "11", "01", "00", "10", respectively. The distributions 860 are interspersed with valley margins 880A-C. The valley margins 880A-C have corresponding reference voltage levels 870A-C used to read the memory cells.

As the memory cells continue to lose charge with time or due to a high workload, the valley margins narrows. Referring to FIG. 7, a strict (STRICT=200 millivolts) folding threshold, thus, ensures a wide valley margin in comparison with a loose (LOOSE=50 millivolts) folding threshold. A wide valley margin tolerates a larger working range of control voltages by the cells of the block and ensures fewer errors from the block.

FIG. 9 is a flow diagram of an example method 900 to adaptively scan a block of a memory device, in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the adaptive scan component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 901, processing logic maintains metadata associating each block of a plurality of blocks of the memory device with a corresponding frequency access group, where each frequency access group is associated with a corresponding scan frequency. The metadata can be a group metadata 321 as disclosed in FIG. 3. The group metadata specifies which frequency access group (e.g., hot, warm, or cold) is associated to each of the blocks in the memory device. The group metadata can be derived from the read count metadata 311, as disclosed in FIG. 3. Adaptive scan component 113 can store the read count metadata for each block, where the read count metadata stores the number of read accesses performed on the block. Adaptive scan component 113 can associate a block to one or more frequency access groups using the read count metadata.

At operation 903, processing logic determines that a first predetermined time period has elapsed since a last scan operation performed with respect to one or more blocks of the memory device, wherein the first predetermined time period specifies a first scan frequency. The first predetermined time period is one cycle of the first scan frequency. Every cycle triggers a scan for a respective group. For example, the hot group can be scanned every 2 weeks, the warm group every 1 month, and the cold group every 2 months.

At operation 905, processing logic selects, based on the metadata, at least one block from a first frequency access group (e.g., cold) associated with the first scan frequency (e.g., COLD_FREQ). Process logic can select at least one block in the group metadata 321 that has the value cold=1. The at least one block can be selected according to the indices of the blocks, e.g., G[0][1]=1 in FIG. 3, or randomly selected from among the blocks having the value cold=1.

At operation 907, processing logic performs a scan operation with respect to the selected block. In one embodiment, performing the scan operation includes determining that a value of a data state metric of the block is above a predetermined data state metric threshold value corresponding to the first frequency access group, and performing a media management operation with respect to the block. For example, determining that a value of a data state metric can include performing a number of read operations to determine the error bits count in a page. In one embodiment, a predetermined number of page read operations can be performed on the block, at random pages, to detect the error bits count. The error bits count per page can be determined by applying an average function to the count of error bits for the pages. A media management operation is performed if the error bits count is above an error bit count threshold corresponding to the first frequency access group.

Responsive to reading a page from the block, processing logic can increment the read count metadata of the block (read count=read count+1). Processing logic can determine that the read count for the block is greater than a read count threshold (e.g., COLD_TH) associated with the first frequency access group (e.g., cold). Processing logic can associate the block with a second frequency access group (e.g., warm) of the plurality of frequency access groups by updating the group metadata for the block, wherein the second frequency access group is associated with a second scan frequency (e.g., WARM_FREQ). Processing logic can scan the block according to the second scan frequency (e.g., WARM_FREQ).

Adaptive scan component 113 can store a frequency access group metadata that represents the groups for the blocks in the memory device. Blocks with read count less than a COLD_TH is associated with a cold frequency access group. Blocks with read count less than a HOT_TH but greater than the COLD_TH is associated with a warm frequency access group. Blocks with read count greater than the HOT_TH is associated with a hot frequency access group.

In one embodiment, scanning the block includes determining one or more valley margins for the memory cells within the block, where the one or more valley margins are used to separate charge states for the memory cells within the block, and responsive to determining that a valley margin is less than a margin threshold associated to the second frequency access group, performing a media management operation with respect to the block.

In one embodiment, processing logic resets the read count for the block in response to an erase operation performed on the block. In one embodiment, processing logic determines a time interval the memory device has been powered on (e.g., POT) for the memory device, and resets the read count of the block in response to the time interval satisfying a predetermined condition (e.g., POT % t==0). In one embodiment, processing logic scans the block in response to the POT satisfying the predetermined condition.

FIG. 10 is a flow diagram of an example method 1000 to adaptively scan a block of a memory device, in accordance with some embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the adaptive scan component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1001, processing logic determines that a first block of a memory device is associated, based on a read count of the block, with a first group (e.g., cold) of a number of groups, wherein the first group is associated with a first scan frequency (e.g., COLD_FREQ).

At operation 1003, processing logic scans the first block at a frequency according to the first scan frequency (e.g., COLD_FREQ). In one embodiment, scanning the first block further includes determining a number of error bits for a plurality of memory cells within the first block, and responsive to determining that the number of error bits is above an error threshold associated to the second group, performing a media management operation with respect to the first block. In one embodiment, determining the number of error bits for a number of memory cells within the first block includes determining an average of the error counts for a predetermined number of randomly selected pages within the first block.

In one embodiment, scanning the first block further includes determining one or more valley margins for the plurality of memory cells within the first block, wherein the one or more valley margins are used to separate charge states for the plurality of memory cells within the first block, and responsive to determining that a valley margin is less than a margin threshold associated to the second group, performing a media management operation with respect to the first block.

At operation 1005, processing logic scans a second block at a frequency according to a second scan frequency (e.g., WARM_FREQ), where the second block is associated with a second group and the second group is associated with the second scan frequency (e.g., WARM_FREQ).

In one embodiment, processing logic determines a power on time (POT) for the memory device associated with the first block, where the POT is a time interval the memory device has been powered on, and resets the read count of the first block in response to the POT satisfying a predetermined condition (e.g., POT % t). In one embodiment, processing logic scans the first block in response to the POT satisfying the predetermined condition. In one embodiment, processing logic increments the read count in response to a performing a read on the first block.

Figure 11:
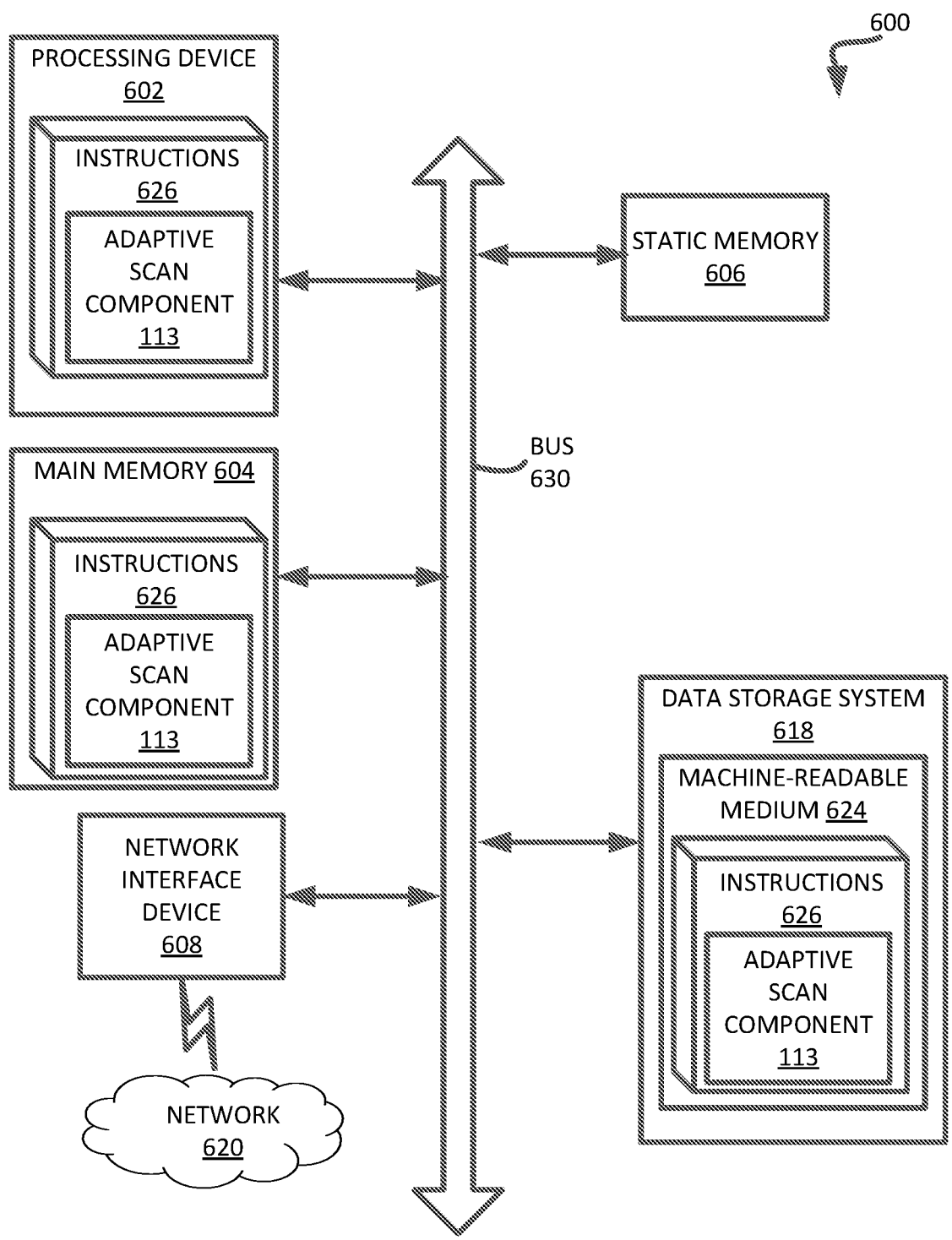
FIG. 11 is a block diagram of an example computer system in which embodiments of the present disclosure can operate.

FIG. 11 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the adaptive scan component 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1A.

In one embodiment, the instructions 626 include instructions to implement functionality corresponding to an adaptive scan component (e.g., the adaptive scan component 113 of FIG. 1A). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer.

Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled with a plurality of memory devices, to perform operations comprising:
        associating each block of a plurality of blocks of the memory device with a corresponding frequency access group of a plurality of frequency access groups based on corresponding access frequencies; and
        performing scan operations on blocks of each of the plurality of frequency access groups using a scan frequency that is different from scan frequencies of other frequency access groups, wherein a scan operation performed on a frequency access group with a higher access frequency uses a higher scan frequency than a scan operation performed on a frequency access group with a lower access frequency.

2. The system of claim 1, wherein each frequency access group is associated with a corresponding scan frequency, and an association of each block of the plurality of blocks of the memory device with the corresponding frequency access group is stored as metadata.

3. The system of claim 2, wherein the operations further comprise:
    determining that a first predetermined time period has elapsed since a last scan operation performed with respect to one or more blocks of the memory device, wherein the first predetermined time period specifies a first scan frequency; and
    selecting, based on the metadata, at least one block from a first frequency access group associated with the first scan frequency; and
    wherein performing the scan operations comprises performing a scan operation with respect to the selected block.

4. The system of claim 3, wherein the operations further comprise:
    responsive to reading a page from the block, incrementing a read count for the block;
    determining that the read count for the block is greater than a read count threshold corresponding to the first frequency access group;
    associating the block with a second frequency access group of the plurality of frequency access groups by updating the metadata for the block, wherein the second frequency access group is associated with a second scan frequency; and
    scanning the block according to the second scan frequency.

5. The system of claim 4, wherein the operations further comprise resetting the read count for the block in response to an erase operation performed on the block.

6. The system of claim 4, wherein the operations further comprise:
    determining a time interval the memory device has been powered on; and
    resetting the read count of the block in response to the time interval satisfying a predetermined condition.

7. The system of claim 3, wherein performing the scan operations further comprises:
    determining that a value of a data state metric of the block is above a predetermined data state metric threshold value corresponding to the first frequency access group; and
    performing a media management operation with respect to the block.

8. The system of claim 7, wherein determining that the value of the data state metric of the block is above the predetermined data state metric threshold value corresponding to the first frequency access group comprises:
    determining a number of error bits for a plurality of memory cells within the block; and
    determining that the number of error bits is above an error bit count threshold corresponding to the first frequency access group.

9. The system of claim 8, wherein determining the number of error bits for a plurality of memory cells within the block further comprises:
    determining an average count of error bits per page for each page of a predetermined number of randomly selected pages within the block.

10. A method, comprising:
    associating each block of a plurality of blocks of a memory device with a corresponding frequency access group of a plurality of frequency access groups based on corresponding access frequencies; and
    performing scan operations on blocks of each of the plurality of frequency access groups using a scan frequency that is different from scan frequencies of other frequency access groups, wherein a scan operation performed on a frequency access group with a higher access frequency uses a higher scan frequency than a scan operation performed on a frequency access group with a lower access frequency.

11. The method of claim 10, wherein each frequency access group is associated with a corresponding scan frequency, and an association of each block of the plurality of blocks of the memory device with the corresponding frequency access group is stored as metadata.

12. The method of claim 11, further comprising:
determining that a first predetermined time period has elapsed since a last scan operation performed with respect to one or more blocks of the memory device, wherein the first predetermined time period specifies a first scan frequency; and
selecting, based on the metadata, at least one block from a first frequency access group associated with the first scan frequency; and
wherein performing the scan operations comprises performing a scan operation with respect to the selected block.

13. The method of claim 12, further comprising:
responsive to reading a page from the block, incrementing a read count for the block;
determining that the read count for the block is greater than a read count threshold corresponding to the first frequency access group;
associating the block with a second frequency access group of the plurality of frequency access groups by updating the metadata for the block, wherein the second frequency access group is associated with a second scan frequency; and
scanning the block according to the second scan frequency.

14. The method of claim 12, wherein performing the scan operations further comprises:
determining that a value of a data state metric of the block is above a predetermined data state metric threshold value corresponding to the first frequency access group; and
performing a media management operation with respect to the block.

15. The method of claim 14, wherein determining that the value of the data state metric of the block is above the predetermined data state metric threshold value corresponding to the first frequency access group comprises:
determining a number of error bits for a plurality of memory cells within the block; and
determining that the number of error bits is above an error bit count threshold corresponding to the first frequency access group.

16. A non-transitory computer-readable storage medium comprising instructions that, when executed by a processing device, cause the processing device to perform operations comprising:

associating each block of a plurality of blocks of a memory device with a corresponding frequency access group of a plurality of frequency access groups based on corresponding access frequencies; and
performing scan operations on blocks of each of the plurality of frequency access groups using a scan frequency that is different from scan frequencies of other frequency access groups, wherein a scan operation performed on a frequency access group with a higher access frequency uses a higher scan frequency than a scan operation performed on a frequency access group with a lower access frequency.

17. The non-transitory computer-readable storage medium of claim 16, wherein each frequency access group is associated with a corresponding scan frequency, and an association of each block of the plurality of blocks of the memory device with the corresponding frequency access group is stored as metadata.

18. The non-transitory computer-readable storage medium of claim 17, wherein the operations further comprise:
determining that a first predetermined time period has elapsed since a last scan operation performed with respect to one or more blocks of the memory device, wherein the first predetermined time period specifies a first scan frequency; and
selecting, based on the metadata, at least one block from a first frequency access group associated with the first scan frequency; and
wherein performing the scan operations comprises performing a scan operation with respect to the selected block.

19. The non-transitory computer-readable storage medium of claim 18, wherein performing the scan operations further comprises:
determining that a value of a data state metric of the block is above a predetermined data state metric threshold value corresponding to the first frequency access group; and
performing a media management operation with respect to the block.

20. The non-transitory computer-readable storage medium of claim 19, wherein determining that the value of the data state metric of the block is above the predetermined data state metric threshold value corresponding to the first frequency access group comprises: determining a number of error bits for a plurality of memory cells within the block; and determining that the number of error bits is above an error bit count threshold corresponding to the first frequency access group.

* * * * *